(12) United States Patent
Ye et al.

(10) Patent No.: US 12,100,800 B2
(45) Date of Patent: Sep. 24, 2024

(54) SOLID STATE ELECTROLYTES

(71) Applicant: Lawrence Livermore National Security, LLC, Livermore, CA (US)

(72) Inventors: Jianchao Ye, Tracy, CA (US); Jose Ali Espitia, Livermore, CA (US); John Miller, Walnut Creek, CA (US); Marissa Wood, Oakland, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 108 days.

(21) Appl. No.: 17/231,886

(22) Filed: Apr. 15, 2021

(65) Prior Publication Data
US 2022/0336847 A1 Oct. 20, 2022

(51) Int. Cl.
*H01M 10/0562* (2010.01)
*C01G 25/00* (2006.01)
*C23C 16/40* (2006.01)
*C23C 16/455* (2006.01)
*H01M 4/02* (2006.01)
*H01M 4/62* (2006.01)
*H01M 10/0525* (2010.01)

(52) U.S. Cl.
CPC ...... *H01M 10/0562* (2013.01); *C01G 25/006* (2013.01); *C23C 16/40* (2013.01); *C23C 16/45555* (2013.01); *H01M 4/62* (2013.01); *H01M 10/0525* (2013.01); *C01P 2002/52* (2013.01); *C01P 2002/72* (2013.01); *C01P 2004/03* (2013.01); *C01P 2004/84* (2013.01); *C01P 2006/40* (2013.01); *H01M 2004/028* (2013.01); *H01M 2300/0077* (2013.01); *H01M 2300/0094* (2013.01)

(58) Field of Classification Search
CPC ............... H01M 10/0562; H01M 4/62; H01M 10/0525; H01M 2004/028; H01M 2300/0077; H01M 2300/0094; C01G 25/006; C23C 16/40; C23C 16/45555; C01P 2002/52; C01P 2002/72; C01P 2004/03; C01P 2004/84; C01P 2006/40
See application file for complete search history.

(56) References Cited

U.S. PATENT DOCUMENTS

| | | | | |
|---|---|---|---|---|
| 2016/0248118 | A1* | 8/2016 | Chan | D01D 5/0015 |
| 2017/0338522 | A1* | 11/2017 | Hu | H01M 10/4235 |
| 2019/0006707 | A1* | 1/2019 | Sakamoto | H01M 10/052 |
| 2020/0067142 | A1* | 2/2020 | Doye | H01M 10/052 |

OTHER PUBLICATIONS

Han et al., Negating interfacial impedance in garnet-based solid-state Li metal batteries, 2017, Nature Materials, 16, 572-579 (Year: 2017).*

(Continued)

*Primary Examiner* — Daniel S Gatewood
(74) *Attorney, Agent, or Firm* — Zilka-Kotab, P.C.

(57) ABSTRACT

A product includes a solid state electrolyte particle coated with a coating consisting essentially of metal oxide. A method includes depositing a coating on a solid state electrolyte particle by atomic layer deposition. A method includes fabricating a product using a plurality of solid state electrolyte particles coated with a coating consisting essentially of metal oxide.

19 Claims, 5 Drawing Sheets

(56) References Cited

OTHER PUBLICATIONS

Kamaya et al., "A lithium superionic conductor," Nature Materials, vol. 10, Sep. 2011, pp. 682-686.
Miara et al., "About the Compatibility between High Voltage Spinel Cathode Materials and Solid Oxide Electrolytes as a Function of Temperature," ACS Applied Materials & Interfaces, vol. 08, 2016, pp. 26842-26850.
McOwen et al., "3D-Printing Electrolytes for Solid-State Batteries," Advanced Materials, vol. 30, 2018, pp. 7 pages.
Ohta et al., "Co-sinterable lithium garnet-type oxide electrolyte with cathode for all-solid-state lithium ion battery," Journal of Power Sources, vol. 265, 2014, pp. 40-44.
Lipson et al., "Nanoscale Investigation of Solid Electrolyte Interphase Inhibition on Li-Ion Battery MnO Electrodes via Atomic Layer Deposition of Al2O3," Chemistry of Materials, vol. 26, 2014, pp. 935-940.
Tang et al., "Unparalleled Lithium and Sodium Superionic Conduction in Solid Electrolytes with Large Monovalent Cage-like Anions," Energy & Environmental Science, 2015, 19 pages, retrieved from https://www.osti.gov/pages/biblio/1327910.
Wang et al., "Design principles for solid-state lithium superionic conductors," Nature Materials, Aug. 2015, 7 pages.
Kato et al., "High-power all-solid-state batteries using sulfide superionic conductors," Nature Energy, vol. 1, Apr. 2016, pp. 1-7.
Ren et al., "Chemical compatibility between garnet-like solid state electrolyte Li6.75La3Zr1.75Ta0.25O12 and major commercial lithium battery cathode materials," Journal of Materiomics, vol. 2, Sep. 2016, pp. 256-264.
Sun et al., "3D Printing of Interdigitated Li-Ion Microbattery Architectures," Advanced Materials, vol. 25, 2013, pp. 4539-4543.
Wei et al., "3D Printing of Customized Li-Ion Batteries with Thick Electrodes," Advanced Materials, 2018, 7 pages.
Zheng et al., "Ultra-light, Ultra-stiff Mechanical Metamaterials," Science, Jun. 2014, 13 pages.
Zheng et al., "Multi-scale Metallic Metamaterials," Nature Materials, 2016, 38 pages, retrieved from https://www.osti.gov/pages/biblio/1458708.
Wang et al., "Lightweight Mechanical Metamaterials with Tunable Negative Thermal Expansion," Physical Review Letters, vol. 117, Oct. 21, 2016, 13 pages.
Yu et al., "Grain Boundary Contributions to Li-Ion Transport in the Solid Electrolyte Li7La3Zr2O12 (LLZO)," Chemistry of Materials, vol. 29, 2017, pp. 9639-9647.

Cheng et al., "Effect of Surface Microstructure on Electrochemical Performance of Garnet Solid Electrolytes," ACS Applied Materials & Interfaces, vol. 7, 2015, pp. 2073-2081.
Zhang et al., "Flexible and ion-conducting membrane electrolytes for solid-state lithium batteries: Dispersion of garnet nanoparticles in insulating polyethyleneoxide," Nano Energy, vol. 28, 2016, pp. 447-454.
Ye et al. "Enhanced lithiation and fracture behavior of silicon mesoscale pillars via atomic layer coatings and geometry design," Journal of Power Sources, vol. 248, 2014, pp. 447-456.
Guan et al., "Highly Stable and Reversible Lithium Storage in SnO2 Nanowires Surface Coated With A Uniform Hollow Shell by Atomic Layer Deposition," Nano letters, 2014, 19 pages, retrieved from https://www.semanticscholar.org/paper/Highly-stable-and-reversible-lithium-storage-in-a-Guan-Wang/25ab1366211ddd83a42ae1dcf8802a4fd745d670.
Kim et al., "Unexpected high power performance of atomic layer deposition coated Li[Ni1/3Mn1/3Co1/3]O2 cathodes," Journal of Power Sources, vol. 254, 2014, pp. 190-197.
Li et al., "Atomic layer deposition of solid-state electrolyte coated cathode materials with superior highvoltage cycling behavior for lithium ion battery application," Energy Environmental Science, vol. 7, pp. 768-778.
Woo et al., "Nanoscale Interface Modification of LiCoO2 by Al2O3 Atomic Layer Deposition for Solid-State Li Batteries," Journal of The Electrochemical Society, vol. 159, 2012, pp. A1120-A1124.
Han et al., "Negating Interfacial Impedance in Garnet-Based Solid-State Li-Metal Batteries," Nature Materials, vol. 16, 2016 33 pages, retrieved from https://www.osti.gov/biblio/1433807.
Cho et al., "Mechanical properties of the solid Li-ion conducting electrolyte: Li0.33La0.57TiO3," Journal of Materials Science, 2012, pp. 5970-5977.
Wolfenstine et al., "A preliminary investigation of fracture toughness of Li7La3Zr2O12 and its comparison to other solid Li-ion conductors," Materials Letters, vol. 96, 2013, pp. 117-120.
McGrogan et al., "Compliant yet Brittle Mechanical Behavior of Li2S—P2S5 Lithium-ion Conducting Solid Electrolyte," Advanced Energy Materials, vol. 7, 2017, 16 pages.
Biener et al., "ALD Functionalized Nanoporous Gold: Thermal Stability, Mechanical Properties, and Catalytic Activity," Nano Letters, vol. 11, 2011, pp. 3085-3090.
Duoss et al., "Three-Dimensional Printing of Elastomeric, Cellular Architectures with Negative Stiffness," Advanced Functional Materials, vol. 24, 2014, pp. 4905-4913.
Zhu et al., "Supercapacitors Based on Three-Dimensional Hierarchical Graphene Aerogels with Periodic Macropores," Nano Letters, vol. 16, 2016, pp. 3448-3456.

* cited by examiner

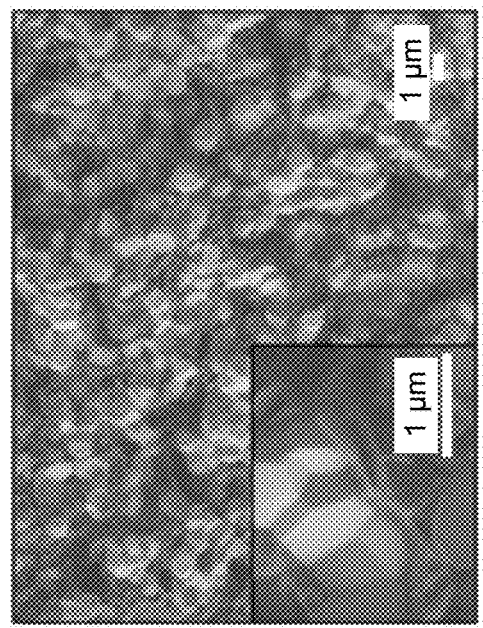
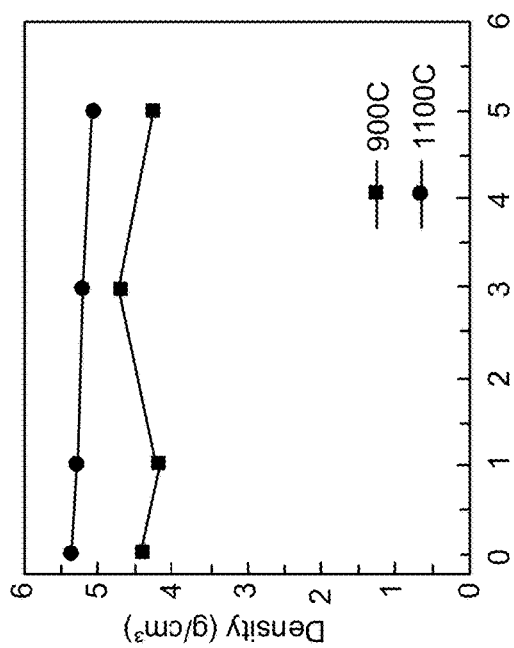
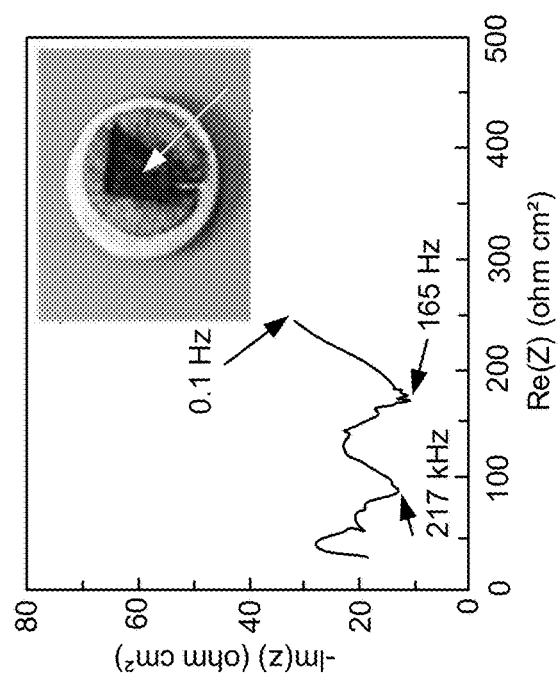
FIG. 3A
FIG. 3B
FIG. 3C

SOLID STATE ELECTROLYTES

This invention was made with Government support under Contract No. DE-AC52-07NA27344 awarded by the United States Department of Energy. The Government has certain rights in the invention.

FIELD OF THE INVENTION

The present invention relates to solid state electrolytes (SSEs), and more particularly, this invention relates to solid state electrolytes having surface modification for enhancing the performance of the solid state electrolytes.

BACKGROUND

Conventional lithium-ion (Li-ion) batteries based on liquid organic electrolytes or gel polymer electrolytes have raised severe safety concerns due to the intrinsic flammable properties of the organic electrolytes. Conventional Li-ion batteries are also not ideal for the use of high energy density metallic Li anodes owing to Li dendrite growth that can short the battery. There remains an urgent need to develop safe, high-performance solid state batteries (SSBs) with advanced electrolyte and separator technologies.

SUMMARY

A product, according to one general aspect, includes a solid state electrolyte particle coated with a coating consisting essentially of metal oxide.

A method, according to another general aspect, includes depositing a coating on a solid state electrolyte particle by atomic layer deposition.

A method, according to yet another general aspect, includes fabricating a product using a plurality of solid state electrolyte particles coated with a coating consisting essentially of metal oxide.

Other aspects and advantages of the present invention will become apparent from the following detailed description, which, when taken in conjunction with the drawings, illustrate by way of example the principles of the invention.

BRIEF DESCRIPTION OF THE DRAWINGS

FIG. 3A is a chart of the density of LLZTO-Al pellets with different ALD cycles of $Al_2O_3$ coating after sintering at 900° C. and 1100° C.

FIG. 3B is a scanning electron microscope (SEM) image of LLZTO-1Al with 1 ALD cycle of $Al_2O_3$ sintered at 900° C.

FIG. 3C is a chart including the electrochemical impedance spectroscopy (EIS) of LLZTO-1Al sintered at 900° C.

DETAILED DESCRIPTION

Figure 1:
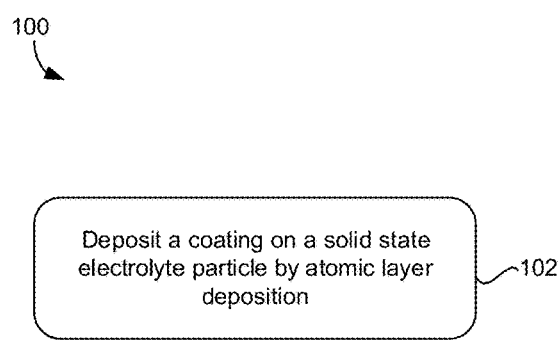
FIG. 1 is a flowchart of a method, in accordance with one aspect of the present disclosure.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred aspects of atomic level deposition for surface modifications of solid state electrolyte particles for enhancing the performance of solid state electrolytes and/or related products and methods.

In one general aspect, a product includes a solid state electrolyte particle coated with a coating consisting essentially of metal oxide.

In another general aspect, a method includes depositing a coating on a solid state electrolyte particle by atomic layer deposition.

In yet another general aspect, a method includes fabricating a product using a plurality of solid state electrolyte particles coated with a coating consisting essentially of metal oxide.

Conventional Li-ion batteries are experiencing bottlenecks in further improving energy density and enhancing safety due to the use of organic electrolytes that have a narrow voltage stability window, are unable to block Li dendrite growth, and are prone to flammability. By replacing organic electrolytes with ceramic-based solid state electrolytes, the energy density may be improved by utilizing metallic lithium as an anode and high capacity or high voltage cathodes. The solid state batteries are also much safer by eliminating "thermal runaway" concerns. Solid state batteries are still far away from commercialization due to the conductivity and interfacial stability issues that are closely related to material processing and integration. Taking garnet-type solid state electrolytes such as $Li_7La_3Zr_2O_{12}$ (LLZO) as an example, LLZO has high ionic conductivity ($10^{-3}$ S/cm) and a wide voltage stability window. However, LLZO requires high sintering temperatures (e.g., typically greater than 1100° C.) for densification. The surface is easily contaminated in conventional processes by a layer of $Li_2CO_3$ due to air exposure, which leads to poor wettability with metallic lithium, as well as large charge transfer resistance.

Doping solid state electrolytes with various elements and adding sintering agents have been explored as methods to reduce the sintering temperature. However, at lower sintering temperatures, the increase of grain boundaries leads to a reduction of ionic conductivity, and the temperature is still high enough to introduce side reactions during cathode/electrolyte co-sintering. For example, a series of superionic conductors has been developed for electrolytes and separators; however, their performance does not satisfy this demanding criteria due to large impedance from poor solid electrolyte-electrode contact and questionable electrochemical and mechanical stability. Unlike the well-established roll-to-roll fabrication of conventional Li-ion batteries, the processing of SSBs is unique due to the brittleness of solid state electrolytes (SSEs). Commercially available or lab-developed SSE discs are usually very thick (e.g., hundreds of micrometers to millimeters thick) to reduce handling issues resulting from their brittle nature. This thickness increases the cell impedance and accounts for the majority of the overall cell weight and volume, leading to dramatically decreased power and energy densities.

The processing of LLZO materials typically requires special care, such as high sintering temperatures for good densification and conductivity, and careful surface treatment for lower charge transfer resistance. Surface treatments such as mechanical polishing, annealing, coating, and acid treatments have been applied to sintered LLZO pellets to enhance the contact between LLZO and lithium. However, those post treatments have their own limitations. For example, mechanical polishing cannot be performed on thin films, and annealing in inert environments or in a vacuum is time consuming. Coating typically requires expensive facilities, and acid treatment may introduce $Li^+/H^+$ exchange or over-etching that could degrade the material properties.

In stark contrast, according to at least some aspects described herein, surface modifications may be used to treat a large quantity of LLZO powder to dramatically improve the electrochemical performance of sintered LLZO pellets. At least some aspects described herein include atomic layer deposition (ALD) to treat LLZO powders, especially tantalum (Ta) doped LLZO powder, to overcome the aforementioned deficiencies in conventional treatments. For example, after a single cycle of atomic layer deposition of $Al_2O_3$ on Ta-doped LLZO powder, hydraulic pressed Ta-LLZO pellets sintered at 900° C. exhibit densities of 74%, greater than $10^{-4}$ S/cm ionic conductivity at room temperature (RT), and less than 100 ohm $cm^2$ charge transfer resistance against Li. In contrast, without the ALD coating, under the same sintering temperature (e.g., sintered at 900° C.), the RT ionic conductivity is only $6.7 \times 10^{-6}$ S/cm, and the charge transfer resistance is $8.6 \times 10^3$ ohm $cm^2$. The inventors were surprised that the resulting coated solid state electrolyte particles exhibited such improvements with only a single coating using the ALD process. Similar results would be achievable for other types of coated particles and pellets described herein.

In preferred approaches, the coating material may include $Al_2O_3$ or other metal oxides. Aluminum (Al) is able to enter into the LLZO lattice, resulting in dual doping. The dual doping effect further enhances ionic conductivity. The $Al_2O_3$ coating regulates the decomposition of $Li_2CO_3$ and allows Li to be returned to the LLZO during sintering. Furthermore, the $Al_2O_3$ aggregates on the surface of the LLZO pellets and enhances contact between the LLZO and Al.

At least some aspects of the present disclosure provide the following advantages. The simplified processing enables a large amount of powder to be treated using a simplified atomic layer deposition facility. For example, at lab scale, 1 kg of powder may be coated in each treatment process. At industrial scale, a much higher quantity of powder may be coated. The coated powders may be pressed into pellets for further electrochemical testing and/or use in various applications. Another advantage is that, after sintering, there is no need to do further surface treatment to enhance wettability. The pellets form substantial contact with melted Li substantially immediately after sintering. In various exemplary aspects, a single cycle of $Al_2O_3$ ALD provides dramatic improvement in conductivity and charge transfer resistance, as compared to conventional treatments. These dramatic improvements with only a single coating using the ALD process were unexpected by the inventors. The inventors would have expected that both the conductivity and the density would have been much lower after a single cycle of ALD. A further advantage to at least some aspects described herein includes enabling the reduction of sintering temperatures to less than 900° C. without sacrificing conductivity and charge transfer.

FIG. 1 is a flowchart of a method 100, in accordance with one aspect. As an option, the present method 100 may be implemented to construct materials, structures, devices, assemblies, etc., such as those described elsewhere herein. Of course, however, this method 100 and others presented herein may be used to form structures and materials for a wide variety of devices and/or purposes which may or may not be related to the illustrative aspects listed herein. Further, the methods presented herein may be carried out in any desired environment. Moreover, more or less steps than those shown in FIG. 1 may be included in method 100, according to various aspects. It should also be noted that any of the aforementioned features may be used in any of the aspects described in accordance with the various methods.

Method 100 includes step 102. Step 102 includes depositing a coating on a solid state electrolyte particle by atomic layer deposition. As noted above, large quantities of such particles can be simultaneously coated in a single ALD step.

Any conventional solid state material amenable to ALD deposition of a metal oxide thereon can be used. In preferred approaches, the solid state electrolyte particle is primarily $Li_7La_3Zr_2O_{12}$ (LLZO). In various approaches, the solid state electrolyte particle is primarily LLZO doped with tantalum (Ta), niobium (Nb), tungsten (W), iron (Fe), silicon (Si), germanium (Ge), gallium (Ga), antimony (Sb), molybdenum (Mo), yttrium (Y), rubidium (Rb), calcium (Ca), barium (Ba), etc., or any combination thereof. According to various aspects of the present disclosure, "primarily" refers to at least 66 weight % of the target material. For example, the solid state electrolyte particle is primarily LLZO where the solid state electrolyte particle is at least 66 weight % LLZO, in preferred aspects. In various approaches, the solid state electrolyte particle may be in a powder form factor. In at least some approaches, conventional feedstock solid state electrolyte particles may be ball milled to reduce the average particle diameter to a predetermined target size, such as in a range of about 5 μm to about 1 μm, to less than about 1 μm, to less than about 500 nm, to less than about 100 nm, etc., in view of the intended application.

In at least some approaches, the solid state electrolyte particles are doped. In one approach, the solid state electrolyte feedstock is already doped when acquired, e.g., purchased from a supplier. In another approach, method 100 includes adding at least one dopant to the solid state electrolyte particles prior to and/or during the deposition of the coating. In some approaches, the solid state electrolyte particle may be doped with any of tantalum (Ta), tungsten (W), aluminum (Al), niobium (Nb), molybdenum (Mo), etc., or any combination thereof.

In various aspects, the coating may include aluminum. In at least some aspects, the coating comprises $Al_2O_3$, other aluminum oxides, other metal oxides including $TiO_2$, ZnO, $SnO_2$, $Fe_2O_3$, MgO, $MnO_2$, NiO, $ZrO_2$, etc., or any combination thereof. The amount and/or identity of the component(s) of the coating may be tuned for the coating effects and/or the intended properties of the formed product, in a manner which would become apparent to one having ordinary skill in the art upon reading the present disclosure and in view of the intended application. For example, the choice of metal oxide may be determined based at least in part on the lithophilic properties of the metal oxide.

In particularly preferred approaches, the coating is applied to the solid state electrolyte particle. In other approaches, the coating may be applied to a cathode material which is mixed with and/or coupled to the solid state particles in a product. Exemplary cathode materials may include $LiCoO_2$, $LiFePO_4$, etc. In yet other approaches, the coating may be applied to both the solid state particle and the cathode material.

In various approaches, the average starting particle size (e.g., the pre-processing size) of the solid state electrolyte particle is in a range of a few micrometers (e.g., about 3 µm to about 5 µm) to about 100 nm in diameter. In at least some approaches, the average particle size of the solid state electrolyte particle size is less than about 200 nm in diameter. Relatively smaller particle sizes enable stronger coating effects (e.g., relatively more uniform coating of the particles) as compared to relatively larger particle sizes, as would be understood by one having ordinary skill in the art upon reading the present disclosure and in view of the intended application of coated solid state electrolyte particles.

The atomic layer deposition process used to coat the solid state electrolyte particle may include placing powders (e.g., solid state electrolyte particle feedstock, any dopant material, any additional material, etc.) into a chamber of an ALD instrument, in a manner known in the art. For example, the ALD instrument may be a rotary ALD reactor of a kind known in the art. In one exemplary aspect, for the deposition of $Al_2O_3$, the powders are exposed to trimethylaluminum (TMA) and ozone ($O_3$) alternatively, with purge steps in between to remove excess precursors. At least one atomic layer of $Al_2O_3$ is deposited on the exposed surfaces of the solid state electrolyte particle(s) in each cycle, and one or more cycles may be performed. Accordingly, $O_3$ may be used in various approaches as an oxygen source in the ALD process. In other approaches, $H_2O$ may be used as an oxygen source in the ALD process. The ALD processes as described herein optimize the rheological properties of the SSE particles by modifying their surface chemistry. ALD enhances the thermochemical stability of the SSE by adding a "barrier" layer and similarly lowers the sintering temperature by adding an amorphous "glue" layer.

The thickness of the coating is precisely controlled by the number of exposure cycles in the ALD process. In various approaches, the ALD process includes at least one cycle. In other approaches, the ALD process includes 1 to 5 cycles, depending on the desired thickness of the coating, as would be determinable by one having ordinary skill in the art in view of the intended application. In various approaches, a cycle may refer to a single exposure of the solid state electrolyte particle to all of the precursors (e.g., the oxygen source, the component(s) of the coating, etc.). In various approaches, the thickness of the coating may be in the range from sub-nanometer to a few nanometers thick. For example, each cycle of the ALD process may add about ≤1 nm of thickness to the coating of the solid state electrolyte particles. In various aspects, the thickness of the coating increases proportionately to each additional ALD cycle, as would become apparent to one having ordinary skill in the art in view of the present disclosure.

In some approaches, the composition of the coating deposited onto the solid state electrolyte particle may be altered for each cycle of the ALD process. For example, method 100 may include depositing a coating of $Al_2O_3$ onto the solid state electrolyte particle in a first cycle, before depositing a coating of $TiO_2$ onto the (now coated) solid state electrolyte particle in a second cycle. Coating compositions may be altered every cycle, every other cycle, etc., in a manner which would be determinable by one having ordinary skill in the art in view of the intended application.

In various preferred aspects, the coating deposited onto the solid state electrolyte particles has physical characteristics of formation by atomic layer deposition. These physical characteristics may include any physical characteristic known by those skilled in the art to be characteristic of ALD, such as a substantially uniform and conformal coating on the outer surface of the solid state electrolyte particles. A conformal coating may refer to a coating where at least 80% of the coating by area has an identical atomic thickness (e.g., the coating is substantially isotropic). For example, the thickness of the coating is uniform at essentially all of the points along the surface of the solid state electrolyte particles. Furthermore, physical characteristics of formation by ALD may include highly precise coatings along the surface of the solid state electrolyte particles. For example, ALD is able to produce very thin, conformal films with precise control of the thickness and composition of the coatings at an atomic level. Ultrathin coatings produced by ALD stabilize electrode performance and are beneficial for improving the cycling stability and contact impedance in solid state battery applications. Furthermore, ALD processes impede the thermal coarsening of materials and lessen various chemical stability issues between SSE and cathode materials.

In at least some approaches, method 100 includes adding at least one additive material to the solid state electrolyte particles prior to and/or after the deposition of the coating. For example, method 100 may include performing atomic layer deposition on a mixture of the solid state particles and the additive material(s). The additive material may include a conventional sintering agent such as $Li_3BO_3$; other additives such as $Li_2O$, $Li_2CO_3$, $LiOH$, $SiO_2$, $LiAlTiPO_4$ (LATP), LiGePS (LGPS), etc., or any combination thereof. In other approaches, various additives may lower the melting point, thereby increasing the density of the resulting coated solid state electrolyte particles. Any combination of additive materials may be added in order to tune the density of the coated solid state electrolyte particles in a manner which would be determinable by one having ordinary skill in the art in view of the intended application.

In at least some approaches, coated solid state electrolyte particles produced according to the method 100 described herein may be cast into films, in a manner known in the art, e.g., via doctor blade, slot die coating, etc.; or pressed to form pellets, in a manner known in the art, e.g., via hydraulic pressing.

In various aspects, method 100 may include thermally treating at least some of the products (e.g., the coated particles, the pressed pellets comprising the coated particles, etc.) as described herein. In some aspects, thermal treatments may be performed in $O_2$ and/or Ar environments. For example, the products may be sintered at a temperature in a range between about 700° C. to about 1200° C., depending on the desired microstructure and/or phase change, as would become apparent to one having ordinary skill in the art upon reading the present disclosure and in view of the intended application.

In one exemplary aspect, Ta-doped LLZO (e.g., LLZTO) powders may be coated with $Al_2O_3$ by one to five cycles of the ALD process described herein. The coated LLZTO powders after pressing into pellets or casting into films may be sintered at 900° C., 1000° C., and 1100° C., and the density of the solid (e.g., the films or pellets) remains in the range of about 76.4% to about 96.5% in all instances. In various approaches, the density of the solid is in a range of about 30% to about 100%. In preferred approaches, the density of the solid is in a range of about 60% to about 99%. In yet further preferred approaches, the density of the solid is greater than or equal to about 90%. The density ranges described herein were unpredictable and the inventors believe that other coated solid state electrolyte particles described herein will similarly maintain densities within these ranges at low sintering temperatures (e.g., less than or equal to 1100° C.). In various preferred aspects, coated solid state electrolyte particles formed according to at least some of the approaches described herein have a density between about 70% and about 90% of the theoretical maximum density for said material. In further preferred aspects, coated solid state electrolyte particles formed according to at least some of the approaches described herein have a density between about 75% and about 96%. For example, the density of LLZTO-1Al (LLZTO powders with one cycle of $Al_2O_3$ coating) sintered at 900° C. is 76.4% and the electrochemical impedance spectroscopy (EIS) reveals an ionic conductivity of greater than or equal to $10^{-4}$ S/cm and a charge transfer resistance of less than or equal to 100 ohm $cm^2$. In contrast, without the $Al_2O_3$ coating, conventional sintered pellets must be further surface treated to reduce the charge transfer resistance.

In some approaches, an $H_3PO_4$/ethanol solution may be used to wash the surface of the sintered LLZTO pellets, according to the presently described aspect, and the resulting measured interfacial impedance is greater than or equal to $10^4$ ohm $cm^2$, which is two orders of magnitude higher than the previously described ALD $Al_2O_3$ coated case. The measured ionic conductivity of pure LLZTO pellet is about $6.5\times10^{-5}$ S/cm, which is also lower than the previously described ALD $Al_2O_3$ coated case.

Figure 2:
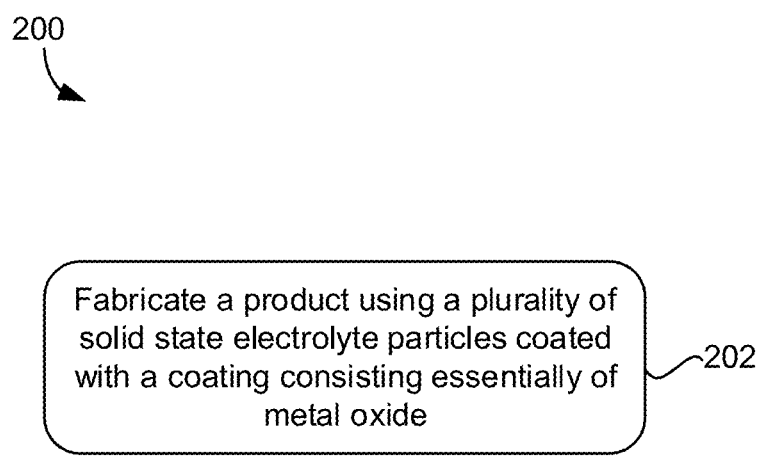
FIG. 2 is a flowchart of a method, in accordance with one aspect of the present disclosure.

FIG. 2 is a flowchart of a method 200, in accordance with one aspect. As an option, the present method 200 may be implemented to construct structures, devices, assemblies, etc., such as those described elsewhere herein. Of course, however, this method 200 and others presented herein may be used to form structures for a wide variety of devices and/or purposes which may or may not be related to the illustrative aspects listed herein. Further, the methods presented herein may be carried out in any desired environment. Moreover, more or less steps than those shown in FIG. 2 may be included in method 200, according to various aspects. It should also be noted that any of the aforementioned features may be used in any of the aspects described in accordance with the various methods.

Method 200 includes step 202. Step 202 includes fabricating a product using a plurality of solid state electrolyte particles coated with a coating consisting essentially of metal oxide. In various approaches, the plurality of solid state electrolyte particles coated with a coating consisting essentially of metal oxide are formed according to at least some of the approaches described with respect to FIG. 1 and method 100.

In at least some approaches, the fabricated product is a solid state battery, or a component part of a solid state battery. In one exemplary aspect, method 200 may include fabricating a solid state battery using the plurality of coated solid state electrolyte particles by forming a coating of the particles on at least one conventional component of a solid state battery. For example, the plurality of coated solid state electrolyte particles may be used to form a coating on a separator component of the solid state battery. The coating of particles may enhance conductivity. In other approaches, method 200 may include fabricating a solid state battery using the plurality of coated solid state electrolyte particles by forming a solid state battery, or at least one component thereof, essentially of the plurality of coated solid state electrolyte particles in a consolidated form factor, in a manner which would be determinable by one having ordinary skill in the art upon reading the present disclosure. For example, the coated solid state electrolyte particles may be used to fabricate ionic conductive separators configured for use in solid state batteries. Such separators may be used transport Li ions between the anode and the cathode of the solid state batteries while preventing short circuits.

In other approaches, the fabricated product is a cathode. For example, method 200 may include fabricating a cathode composite electrode using co-sintering approaches. Solid state electrolyte particles are mixed with active materials including lithium iron phosphate (LFP), lithium manganese oxide (LMO), lithium cobalt oxide (LCO), Lithium-nickel-cobalt-manganese oxide (NMC), Lithium-nickel-cobalt-aluminum oxide (NCA), etc., or any combination thereof, Carbon materials, including carbon black, graphite, graphene, carbon nanotubes, etc., or any combination thereof, and electronic conducting oxides such as indium-tin-oxide (ITO), fluorine tin oxide (FTO), aluminum doped zinc oxide (AZO) may be used as conductive additives. In another approach, a coating of the particles may be formed on a cathode substrate known in the art. In either case, the particles enhance conductivity. In other approaches, method 200 may include fabricating a cathode using the plurality of coated solid state electrolyte particles by forming a cathode essentially of the plurality of coated solid state electrolyte particles in a consolidated form factor, in a manner which would be determinable by one having ordinary skill in the art upon reading the present disclosure.

In yet other approaches, the fabricated product is a feedstock for additive manufacturing. For example, the plurality of coated solid state electrolyte particles may be added to conventional feedstock materials for additive manufacturing techniques known in the art such as direct ink writing (DIW), electrophoretic deposition (EPD), directed energy deposition (DED), stereolithography, etc.

Uses

Various applications of the coated solid state electrolyte particles as described herein include preparation of solid state electrolyte separators and cathode composite structures for printing of solid state batteries. For example, at least some of the products described herein may be mixed with cathode materials including $LiCoO_2$, nickel manganese cobalt (NMC), $LiFePO_4$, nickel cobalt aluminum (NCA), etc., for co-sintering at lower-than-conventional temperatures. Such procedures enable intimate contact for the reduction of interfacial impedance. In one aspect, after sintering the products according to the approaches described herein, the obtained product may be used directly for the assembly of solid state batteries. In some approaches, indium tin oxide (ITO) and/or fluorine doped tin oxide (FTO) nanoparticles or thin coatings may be used to increase the electrical conductivity of the cathode layer.

In at least some approaches, coated solid state electrolyte particles produced according to various aspects described herein may be used to prepare inks for printing to make customized solid state electrolyte products for post-sintering and testing. Various products described herein may be used in additive manufacturing techniques known in the art such as direct ink writing (DIW), electrophoretic deposition (EPD), directed energy deposition (DED), stereolithography, etc. For example, coated solid state electrolyte particles described herein may be added to conventional feedstocks for processes such as known additive manufacturing techniques.

Experimental Design

Surface Modification and Additives to Improve Sintering Kinetics and Conductivity of Printed LLZTO Films Large charge transfer resistance is an obstacle for solid state electrolytes. Although methods like acid surface treatment greatly reduce the charge transfer resistance (e.g., to ~20 ohm cm$^2$) for samples sintered at high temperatures (e.g., ≥1000° C.), the charge transfer resistance is still very large (e.g., —10$^4$ ohm cm$^2$) for samples sintered at low temperatures (e.g., 900° C.). By coating ball-milled LLZTO powder with only one ALD cycle of Al$_2$O$_3$, the inventors observed 10 times higher ionic conductivity (e.g., >10$^{-4}$ S/cm) and 100 times lower charge transfer resistance (e.g., ≤100 ohm cm$^2$) at a sintering temperature of 900° C. for hydraulic pressed pellets as shown in FIGS. 3A-3C. The density at this temperature was still low. The inventors believe this may be improved by adding sintering agents such as Li$_3$BO$_3$. FIG. 3A is a chart of the density of the LLZTO-Al pellets with different ALD cycles of Al$_2$O$_3$ coating after sintering at 900° C. (lower line, squares) and 1100° C. (upper line, circles). FIG. 3B is an SEM image of LLZTO-1Al with 1 ALD cycle of Al$_2$O$_3$ sintered at 900° C. The inset of FIG. 3B is an image showing the existence of a low-z phase between LLZTO grains. FIG. 3C is a chart including the electrochemical impedance spectroscopy (EIS) of LLZTO-1Al sintered at 900° C. The inset of FIG. 3C is an image showing the existence of a disassembled Li/LLZTO-1Al/Li cell with the interface exposed. The arrows indicate the black color formed after contact between the lithium and LLZTO-1Al above the melting point.

Figure 4A:
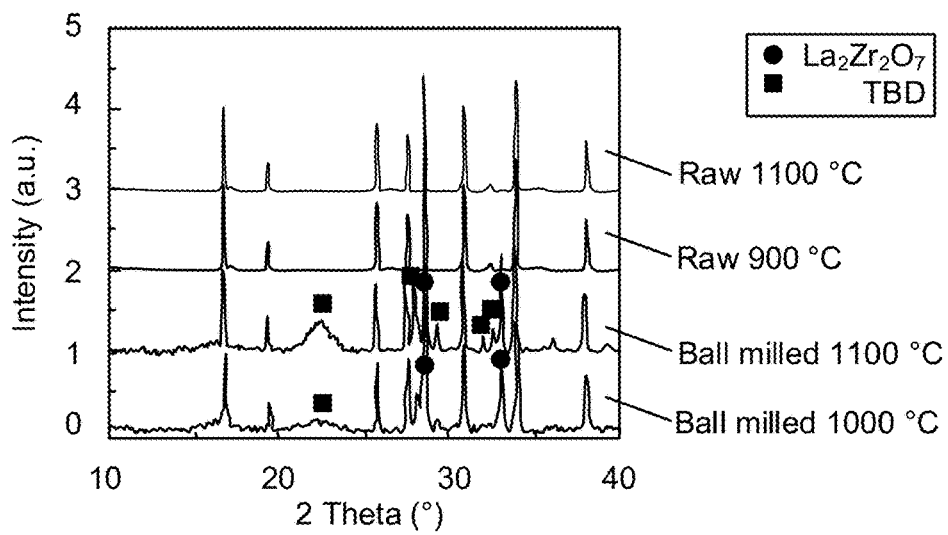
FIG. 4A is a chart of thermal stabilities for printed LLZTO films.
Figure 4B:
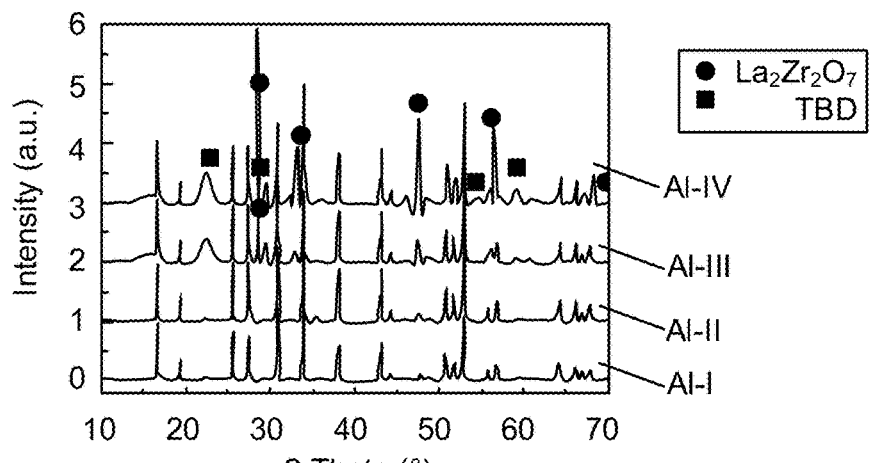
FIG. 4B is a chart of thermal stabilities for printed LLZTO-5LBO-1Al films.
Figure 4C:
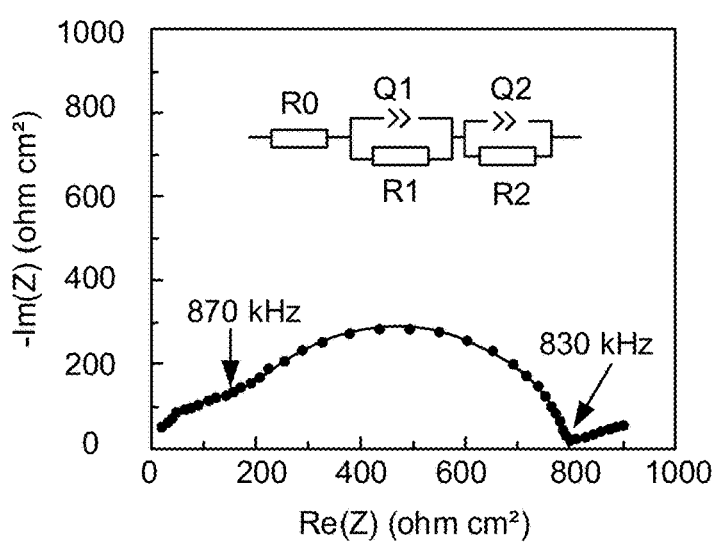
FIG. 4C is a room-temperature Nyquist impedance plot of a LLZTO-5LBO-1Al film sintered at 900° C. in Ar followed by air burning at 700° C.

Printed LLZTO films show different thermal stability than hydraulic pressed pellets. FIG. 4A shows that while films made from pristine LLZTO powder (~7 μm particle size) are very stable up to 1100° C. in Ar, films made from ball milled powder show La$_2$Zr$_2$O$_7$ phase formation at or above 1000° C. FIG. 4A shows, from the bottom to the top, LLZTO film made with ball milled powder, treated in Ar at 1000° C. and 1100° C.; LLZTO film made with pristine (raw) powder, treated at 900° C. and 1100° C. The addition of Li$_3$BO$_3$ and one ALD cycle of Al$_2$O$_3$ coating did not improve the thermal stability or reduce Li loss at high sintering temperatures as shown in FIG. 4B. FIG. 4B shows, from the bottom to the top, LLZTO-5LBO-1Al film treated in Ar at 800° C., 900° C., 1000° C., and 1100° C. However, it did improve the density and eliminate La$_2$Zr$_2$O$_7$ phase formation at 900° C. As a result of improved densification from Li$_3$BO$_3$ and chemical modification by Al$_2$O$_3$, reasonable ionic conductivity (e.g., 7.6×10$^{-5}$ S/cm) and low charge transfer resistance (e.g., 314 ohm cm$^2$) was achieved in the printed thin film after pressureless furnace sintering at 900° C. as shown in FIG. 4C. FIG. 4C is a room-temperature Nyquist impedance plot of a LLZTO-5LBO-1Al film sintered at 900° C. in Ar followed by air burning at 700° C.

Co-Sintering Stability Studies

Figure 5A:
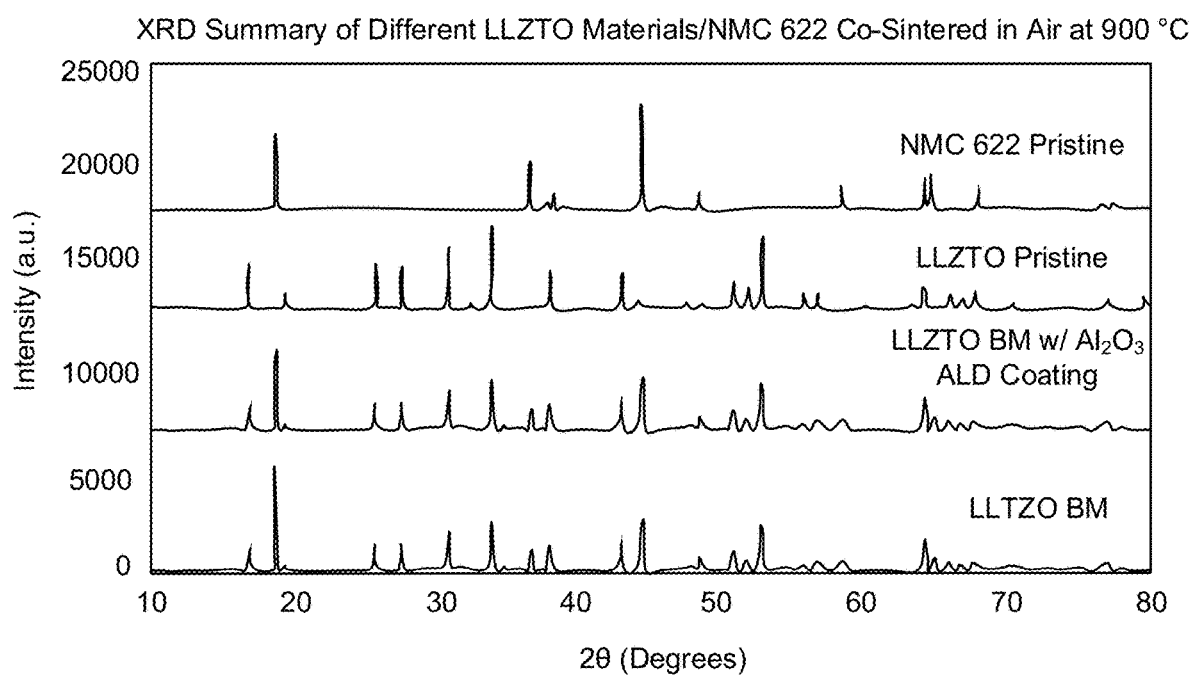
FIG. 5A includes x-ray diffraction (XRD) spectra for LLZTO/NMC 622 samples.
Figure 5B:
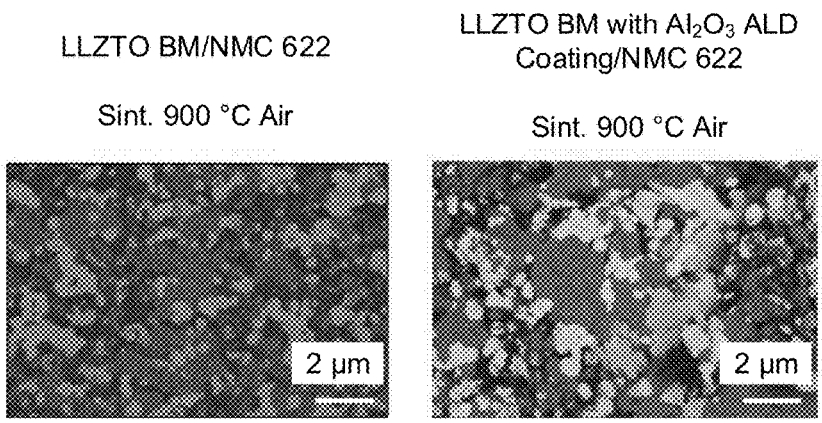
FIG. 5B includes backscattered SEM cross-sections for LLZTO/NMC 622 samples.

One way to improve the solid-solid contact between the cathode and LLZTO electrolyte is to co-sinter them together. However, the thermal stability during co-sintering is not well understood. Therefore, the inventors evaluated the effect of sintering temperature on the densification and structural stability of pellets made with a 1:1 ratio of LLZTO and NMC 622. Two different LLZTO powders were used: ball-milled, and ball-milled with an ALD Al$_2$O$_3$ coating. These samples were sintered at three temperatures (750° C., 900° C., and 1050° C.) for 2 hours in air. The inventors found that NMC 622 is relatively stable with LLZTO at or below 900° C. in air. Although a higher sintering temperature helps enhance the contact between LLZTO and NMC 622, secondary phases were observed in the XRD spectra that could be detrimental to the electrochemical performance. The addition of Al$_2$O$_3$ does not affect thermal stability significantly, and it may be beneficial for densification. FIG. 5A includes XRD spectra for pellets made with different LLZTO powders/NMC 622 co-sintered at 900° C. for 2 hours with mother powder in air. Pellets were prepared by ball milling LLZTO and NMC 622 (both previously ball milled individually) together in a 1:1 wt ratio for 60 min with 3 mm YSZ beads. FIG. 5B shows backscattered SEM images for the LLZTO/NMC 622 samples.

The inventive concepts disclosed herein have been presented by way of example to illustrate the myriad features thereof in a plurality of illustrative scenarios, aspects, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various aspects have been described above, it should be understood that they have been presented by way of example only, and not limitation. Thus, the breadth and scope of an aspect of the present invention should not be limited by any of the above-described exemplary aspects, but should be defined only in accordance with the following claims and their equivalents.

What is claimed is:

1. A product, comprising:
    a cathode formed at least in part from a cathode material mixed with a plurality of solid state electrolyte particles of a powder, each of the solid state electrolyte particles, individually, having a coating thereon, the coating consisting essentially of a first metal oxide in a first layer and a second metal oxide in a second layer, wherein the first and second metal oxides are different.

2. The product of claim 1, wherein each solid state electrolyte particle is primarily Li$_7$La$_3$Zr$_2$O$_{12}$ (LLZO).

3. The product of claim 1, wherein the metal oxides are selected from the group consisting of: Al$_2$O$_3$, TiO$_2$, ZnO, SnO$_2$, Fe$_2$O$_3$, MgO, MnO$_2$, NiO, and ZrO$_2$, wherein an average particle size of the solid state electrolyte particles is less than about 200 nm in diameter.

4. The product of claim 1, wherein the solid state electrolyte particles include at least one dopant material selected from the group consisting of: tantalum (Ta), niobium (Nb), tungsten (W), iron (Fe), silicon (Si), germanium (Ge), gallium (Ga), antimony (Sb), molybdenum (Mo), yttrium (Y), rubidium (Rb), calcium (Ca), barium (Ba).

5. The product of claim 1, wherein the coating has physical characteristics of formation by 15 cycles or less of atomic layer deposition performed on the particles while in loose powdered form.

6. The product of claim 1, comprising the plurality of coated solid state electrolyte particles compressed into a pellet.

7. The product of claim 1, wherein the product is a solid state battery.

8. A method, comprising:
    depositing a coating on each individual particle of a plurality of solid state electrolyte particles in powdered form by 15 cycles or less of atomic layer deposition, the coating comprising a first metal oxide in a first layer and a second metal oxide in a second layer that is formed directly on the first layer, wherein the first and second metal oxides are different.

9. The method of claim 8, wherein each solid state electrolyte particle is primarily $Li_7La_3Zr_2O_{12}$ (LLZO).

10. The method of claim 8, wherein the coating is primarily a metal oxide, wherein the metal oxide is selected from the group consisting of: $Al_2O_3$, $TiO_2$, ZnO, $SnO_2$, $Fe_2O_3$, MgO, $MnO_2$, NiO, and $ZrO_2$.

11. The method of claim 8, wherein the solid state electrolyte particles include at least one dopant material selected from the group consisting of: tantalum (Ta), niobium (Nb), tungsten (W), iron (Fe), silicon (Si), germanium (Ge), gallium (Ga), antimony (Sb), molybdenum (Mo), yttrium (Y), rubidium (Rb), calcium (Ca), barium (Ba).

12. The method of claim 8, comprising consolidating a plurality of the coated solid state electrolyte particles to form pellets.

13. The method of claim 8, comprising combining a plurality of the solid state electrolyte particles with an additive prior to and/or after the depositing, wherein the additive is selected from the group consisting of: $Li_3BO_3$, $Li_2O$, $Li_2CO_3$, $LiAlTiPO_4$ (LATP), LiGePS (LGPS), lithium iron phosphate (LFP), lithium manganese oxide (LMO), graphite, graphene, and carbon nanotubes.

14. A method, comprising:
fabricating a product using a powder of solid state electrolyte particles, each particle being coated with a coating consisting essentially of metal oxides via 15 cycles or less of atomic layer deposition, the coating comprising a first metal oxide in a first layer and a second metal oxide in a second layer, wherein the first and second metal oxides are different.

15. The method of claim 14, wherein the solid state electrolyte particles are primarily $Li_7La_3Zr_2O_{12}$ (LLZO), wherein the metal oxide is selected from the group consisting of: $Al_2O_3$, $TiO_2$, ZnO, $SnO_2$, $Fe_2O_3$, MgO, $MnO_2$, NiO, and $ZrO_2$.

16. The method of claim 14, comprising mixing the coated solid state electrolyte particles with a cathode material to form a mixture; and sintering the mixture of the coated solid state electrolyte particles and the cathode material.

17. The method of claim 14, wherein the product is a feedstock for an additive manufacturing ink having the powder of coated particles therein.

18. The method of claim 16, comprising using the sintered mixture as a cathode in a solid state battery.

19. The method of claim 16, wherein the sintered mixture is used as a cathode in a solid state battery.

* * * * *